United States Patent
Carvalho et al.

(10) Patent No.: US 7,358,871 B2
(45) Date of Patent: Apr. 15, 2008

(54) METHOD AND SYSTEM FOR DECODING DATA

(75) Inventors: Luciana Bulgarelli Carvalho, Campinas (BR); Luis Francisco P. Junqueira De Andrade, Campinas (BR); Stefano Pietri, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/510,542

(22) Filed: Aug. 25, 2006

(65) Prior Publication Data

US 2008/0048892 A1  Feb. 28, 2008

(51) Int. Cl.
*H03M 7/12* (2006.01)
(52) U.S. Cl. .......................................... 341/70; 341/68
(58) Field of Classification Search ............. 341/50–90
See application file for complete search history.

(56) References Cited

U.S. PATENT DOCUMENTS

| | | | |
|---|---|---|---|
| 5,287,359 A | 2/1994 | Engelse | |
| 5,446,765 A | 8/1995 | Leger | |
| 5,486,824 A * | 1/1996 | Kinerk et al. | 341/26 |
| 5,491,713 A | 2/1996 | Kwok et al. | |
| 5,586,266 A | 12/1996 | Hershey et al. | |
| 5,726,650 A | 3/1998 | Yeoh et al. | |
| 5,784,298 A | 7/1998 | Hershey et al. | |
| 5,790,610 A | 8/1998 | Julyan | |
| 6,628,212 B1 | 9/2003 | Toutant | |
| 6,977,973 B1 | 12/2005 | Wiggins | |
| 2003/0227987 A1 | 12/2003 | Poletto et al. | |

* cited by examiner

*Primary Examiner*—Lam T. Mai (57) ABSTRACT

A system and method for decoding a received data stream is disclosed. The method includes detecting first and second data transitions of a received data stream. Each of the data transitions is of a first transition type (e.g. rising or falling transition). The time interval between the data transitions is measured, and a logic value of a data bit encoded in the data stream is decoded based on the measured time interval. By decoding the data stream based on the time intervals between data transitions, the number of decoding errors due to timing changes in the data stream (such as changes due to drift or jitter in the data stream) is reduced.

19 Claims, 5 Drawing Sheets

METHOD AND SYSTEM FOR DECODING DATA

FIELD OF THE DISCLOSURE

The present disclosure relates to decoding of received data.

BACKGROUND

Data communicated between electronic devices is typically encoded for transmission at a transmitting device in order to facilitate reliable transmission of the data and reduce transmission errors. For example, data to be transmitted may be encoded to reduce the impact of noise or other factors on the transmitted data. The encoded stream of data bits is then transmitted to a receiving device. At the receiving device, the encoded data is decoded and the data transformed to a useable format for the receiving device.

In order to decode the received data, the receiving device interprets the transmitted data stream at particular time intervals. At each time interval, the receiving device can detect or analyze the received data to determine the state of each received bit. Accordingly, proper decoding of the received data is based on analyzing the data at the appropriate time intervals. The time intervals can be based on a decode clock at the receiving device that is synchronized with a clock at the transmitting device. However, the data transmission intervals for the data stream can vary depending on the transmitting device. Multiple decode clocks can be employed at the receiving device to account for different data transmission intervals, but at an undesirable cost of complexity and device area. Further, maintaining synchronization between a clock and the received data is difficult because of drift or jitter in the transmitted data stream.

Accordingly, there is a need in the art for an improved method and system to decode received data.

DETAILED DESCRIPTION

A system and method for decoding a received data stream is disclosed. The method includes detecting first and second data transitions of a received data stream. Each of the data transitions is of a first transition type (e.g. rising or falling transition). The time interval between the data transitions is measured, and a logic value of a data bit encoded in the data stream is decoded based on the measured time interval. By decoding the data stream based on the time intervals between data transitions, the number of decoding errors due to timing changes in the data stream (such as changes due to drift or jitter in the data stream) is reduced.

Figure 1:
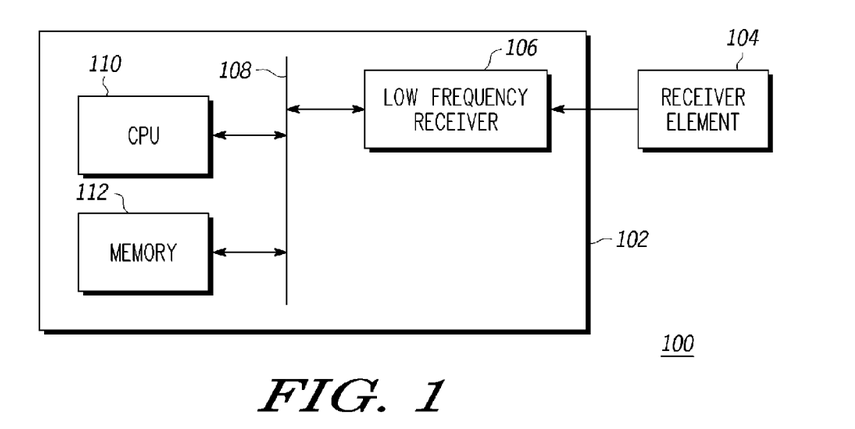
FIG. 1 is a block diagram of a particular embodiment of a system for decoding a data stream.

Referring to FIG. 1, a system 100 for decoding a received data stream is illustrated. The system 100 includes a receiver module 102 and a receiver element 104. The receiver module 102 may be an integrated circuit, a system on a chip, or other appropriate module. The receiver element 104 can be a receiver coil and the like. The receiver module 102 includes a low frequency receiver 106, a system bus 108, a control processor unit (CPU) 110, and a memory 112. The low frequency receiver 106, the CPU 110, and the memory 112 are each connected to the system bus 108. In addition, the low frequency receiver 106 is connected to the receiver element 104.

During operation, the receiver element 104 receives data transmitted from one or more transmitting devices. In a particular embodiment, the received data is encoded data that is transmitted as a serial bitstream such as a Manchester bitstream and the like.

The CPU 110 controls the low frequency receiver 106 to decode the received data. Decoded data is stored at the memory 112. The memory 112 may also store the two time range tables created to decode the received data. Alternatively, the time range tables may be stored at the low frequency receiver 106, in memory external to the receiver module 102, or another appropriate location.

In addition, although for purposes of discussion several decoding functions are discussed herein as being performed at the low frequency receiver 106, it will be appreciated that one or more of these functions could be performed by the CPU 110 or by another module of the system 100. Further, the decoding functions could be performed by hardware, software, a state machine implemented in hardware or software, and the like.

The data received at the receiver element 104 is provided to the low frequency receiver 106. The receiver element 104 can perform other functions. For example, if the data is transmitted wirelessly, the receiver element 104 can remove the carrier frequency for the data.

In a particular embodiment, information received by the low frequency receiver 106 is used to create a first table of time ranges based on information provided within a preamble contained within a header of the received data. The first table of time ranges corresponds to possible intervals of data transmission associated with the data stream. In a particular embodiment, the preamble of the header includes only a few number of data bits. Accordingly, the first table includes a relatively coarse set of possible time ranges. Although the time ranges are sufficient to decode a synchronization word of the header, they are not necessarily sufficient for reliable decoding of a data portion of the data stream.

The low frequency receiver 106 analyzes a synchronization word of the header to select one of the time ranges in the first table. The selected time range is used to decode the synchronization word to obtain a digital authentication value. In a particular embodiment, the received data stream is validated by comparing the authentication value to a predefined value. If the received data stream fails the validation procedure, the low frequency receiver can stop decoding of the data stream.

If the received data stream passes the validation procedure, the low frequency receiver 106 creates a second table of time ranges based on the received synchronization word. In a particular embodiment, the synchronization word includes more data bits than the preamble, and therefore time ranges of the second table are finer (i.e. less coarse) than the time ranges of the first table to allow for more reliable decoding of the data portion of the data stream.

In an alternative embodiment, such as when the timing characteristics of the signal being received is known, the time interval tables are predetermined tables stored in the memory 112. Other methods to create the time interval tables can be used. For example, the time interval tables can be based on a clock signal transmitted by the transmitting device.

In a particular embodiment, the low frequency receiver 106 decodes the received payload data by measuring the time intervals between data transitions of the same type in the received bitstream. The measured time intervals are compared to the time intervals in the second table to determine a decode value associated with the measured interval. Based on the selected decode value and the logic state of the last decoded data bit, a logic value of a data bit of the data stream is decoded. For example, if the decode value is at a first length, a first logic value (e.g. a logic low) is determined for the data bit and if the decoding value is at a second length, a second logic value (e.g. a logic high) is determined for the data bit.

In addition, more than one bit of the data stream may be decoded based on a single measured time interval. For example, if the decode value is at a third length, the low frequency receiver 106 can determine that a first data bit of the data stream has been received that is at a logic high and a second bit of the data stream has been received that is at a logic low.

Figure 2:
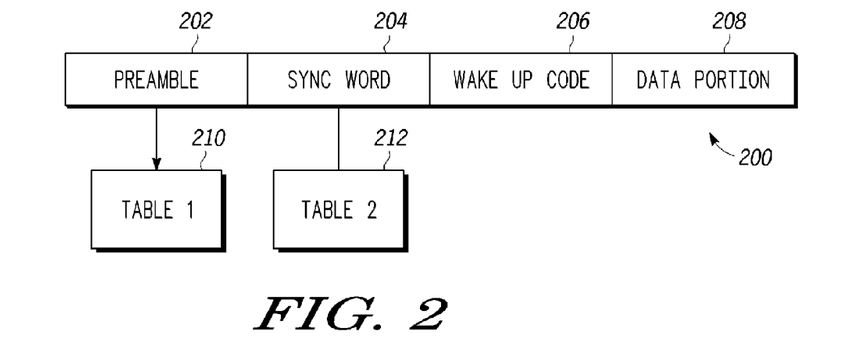
FIG. 2 is a block diagram of a particular embodiment of the data stream and data interval tables utilized by the system of FIG. 1.

Referring to FIG. 2, a particular embodiment of a data stream 200 and associated first time interval table 210 and second time interval table 212 are illustrated. The data stream 200 includes a preamble portion 202, a synchronization word portion 204, a wake-up code portion 206, and a data payload portion 208. The preamble portion 202, the synchronization word portion 204 and the wake-up code portion 206 form a header of the data stream 200.

During operation, the data stream 200 is received by the receiving module 102. Based on the preamble portion 202, the receiving module 102 calculates the first time interval table 210. The first time interval table 210 includes a set of time ranges with each member of the set corresponding to decoding values for the data stream 200.

The receiving module 102 uses the first time interval table to decode the synchronization word portion 204. In a particular embodiment, the receiving device measures the interval between a first edge of the synchronization word 204 and a second edge of the same transition type as the first edge, and compares this measured interval to the set of time intervals in the first time interval table 210 to select a decode value from the table 210 to be used to decode the synchronization word 204. The synchronization word 204 is decoded based on the selected decode value to determine an authentication value, to validate the data stream 200. In a particular embodiment, if the validation process indicates that the data stream 200 is not valid, decoding is not performed on the data payload portion 208.

In addition, a second time interval table 212 is calculated based on the synchronization word 204. The second time interval table 212 includes a second set of time intervals corresponding to decode values used to decode the data payload portion 208. In a particular embodiment, the synchronization word 204 includes more bits of information than the preamble 202, allowing for a more refined set of time intervals to be included in the second time interval table 212 than in the first time interval table 210.

The second time interval table 212 is used by the receiving module 102 to decode the data payload portion 208. In a particular embodiment, the receiving module 102 determines a time interval between successive edges of the same transition type, and compares this measured time interval to the set of time intervals in the time interval table 212. The logic value of one or more data bits of the data stream 200 is determined based upon which decode value in the table corresponds to the measured interval.

The wake-up code portion 206 can also be decoded using the second time interval table 212. The wake-up code portion 206 can include initialization or other data for the low frequency receiver 106.

Figure 3:
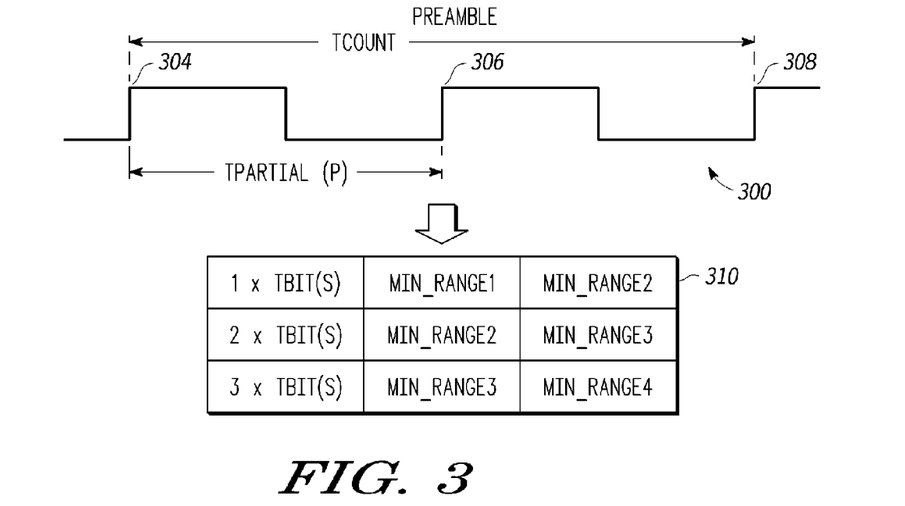
FIG. 3 is a timing diagram illustrating a particular embodiment of a method of creating the first data interval table of FIG. 2.

Referring to FIG. 3, a timing diagram illustrating a particular embodiment of a method of creating a time interval table 310, corresponding to the time interval table 210 of FIG. 2, is depicted. FIG. 3 illustrates a preamble 300 of a received data stream. The preamble includes a rising edge 304, a rising edge 306, and a last rising edge 308. The time interval table 310 is calculated based on the timing between the edges 304, 306, and 308. In particular, the time interval between the edge 304 and the edge 306, labeled as TPARTIAL(P) is measured by the receiving module 102 and the time interval between the edge 304 and the edge 308, labeled as TCOUNT is determined. The value TPARTIAL (P) is compared to an expected maximum and minimum limit. If the value of TPARTIAL exceeds the maximum limit, or is less than the minimum limit, an error condition has occurred. In a particular embodiment, in response to the error condition the time interval table 310 is not calculated.

If the value of TPARTIAL is below the maximum limit and above the minimum limit, the time ranges in the time interval table 310 are calculated according to the following formulae:

$$\text{min\_range1} = \frac{TCOUNT}{2^{N+1}}$$

$$\text{min\_range2} = \frac{TCOUNT}{2^N} + \text{min\_range1}$$

$$\text{min\_range3} = \frac{TCOUNT}{2^N} + \text{min\_range2}$$

$$\text{min\_range4} = \frac{TCOUNT}{2^N} + \text{min\_range3}$$

where N is the number of bits received (or the number of edges of the same type (either rising or falling) minus 1) in the preamble 300.

As illustrated, each time range in the time interval table 310 is associated with a decode value. Each decode value is expressed as a multiple of a value of TBIT, where TBIT is the minimum expected data transmission interval of the data stream.

It will be appreciated that the above formulae involve simple mathematical operations, including addition and division by two. Accordingly, the formulae can be implemented with relatively simple computer hardware. For example, the formulae can be implemented using simple adders to perform the addition operations and shift registers to perform the division operations.

Figure 4:
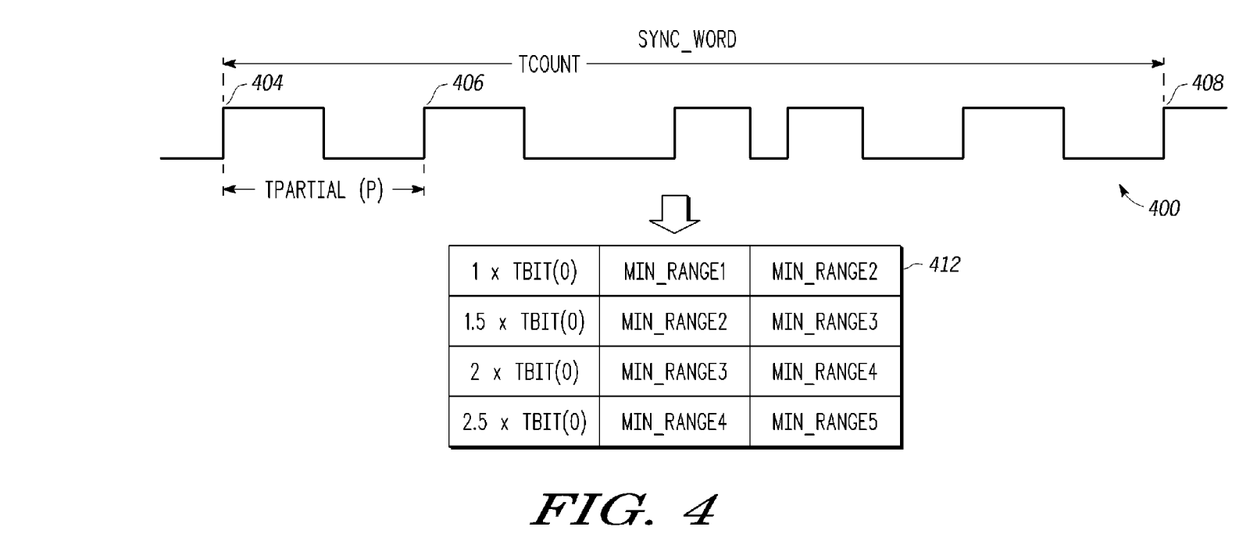
FIG. 4 is a timing diagram illustrating a particular embodiment of a method of creating the second data interval table of FIG. 2.

Referring to FIG. 4, a timing diagram illustrating a particular embodiment of a method of creating a time interval table 412, corresponding to the time interval table 212 of FIG. 2, is depicted. FIG. 4 illustrates a synchronization word 400 having a rising edge 404, a rising edge 406, and a rising edge 408. A time interval table 412 is created by the receiver module 102 based on the synchronization word 400. In addition, the synchronization word 400 is decoded based on the time interval table 310 of FIG. 3. The value of TPARTIAL(S) is compared to the time ranges in the time interval table 310 and the appropriate decode value is selected. The selected decode value, together with the value of the previously decoded data bit of the synchronization word, is used to decode each bit of the synchronization word, and the decoded synchronization word is used to validate the data stream.

The time interval table 412 is calculated determining the value, where TCOUNT corresponds to the time interval between the edge 404 and the edge 408.

The time interval table 412 is calculated based on the following formulae:

$$\text{min\_range1} = \frac{TCOUNT(S)}{2^{N+1}} + \frac{TCOUNT(S)}{2^{N+2}}$$

$$\text{min\_range2} = \frac{TCOUNT(S)}{2^{N}} + \frac{TCOUNT(S)}{2^{N+2}}$$

$$\text{min\_range3} = \frac{TCOUNT(S)}{2^{N}} + \text{min\_range1}$$

$$\text{min\_range4} = \frac{TCOUNT(S)}{2^{N}} + \text{min\_range2}$$

where N is the number of bits (or number of edges of the same type (either rising or falling) minus 1) in the synchronization word 400.

As illustrated, each time range in the time interval table 412 is associated with a decode value. As with the time interval table 310, each decode value is expressed as a multiple of a value of TBIT, where TBIT is the minimum expected data transmission interval of the data stream. Further, as illustrated the time interval table 412 includes a more refined set of data transmission intervals relative to the time interval table 310, thereby permitting more accurate decoding of the data portion of the data stream.

Figure 5:
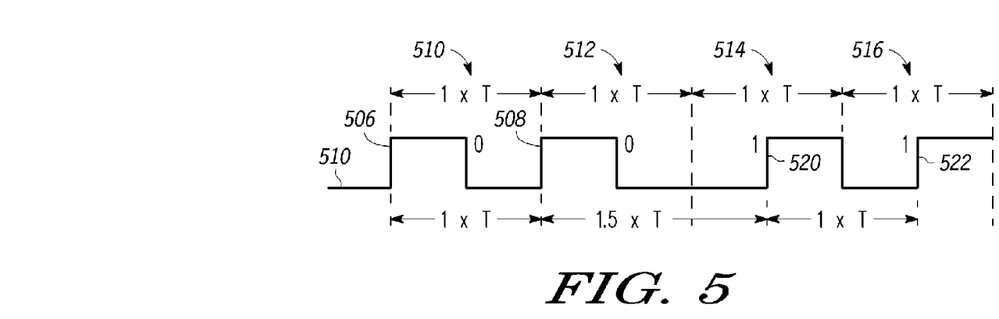
FIG. 5 is a timing diagram illustrating a particular embodiment of a method of decoding the data payload portion of the data stream of FIG. 2

A particular embodiment of a method of decoding the data payload portion of a data stream may be better understood with reference to FIG. 5. FIG. 5 illustrates a timing diagram of a data stream 501, corresponding to a portion of the data stream 200 of FIG. 2. As illustrated, the data stream 501 has been encoded by placing data stream transitions at the approximate center between time intervals, referred to herein as frames. The frames 510, 512, 514, and 516 each represent an interval of time "T."

The data bit encoded in each frame depends on the data stream transition near the center of each frame. Thus, in the illustrated example, frame 510 and frame 512 each have a falling transition in the center of the respective frame, representing a logic 0, while frames 514 and 516 have rising transitions in the center of the frame, representing a logic 1 for each frame. Accordingly, the data stream 501 represents an encoded value of 0011.

In the illustrated embodiment, the data stream 501 is encoded by measuring the time intervals between rising transitions of the data stream 501 and comparing each measured interval to a table of time intervals to decode the received data.

For example, the low frequency receiver 106 measures the time interval between rising transition 506 and rising transition 508 and compares this measured time interval to the table of time intervals to determine that the measured time interval corresponds to a decoding value T. In addition, it is assumed for purposes of discussion that the previously decoded data bit for the data stream 501 had a logic value of 0. Accordingly, based on the decoding value T and the value of the previously decoded data bit, the low frequency receiver 106 decodes the first frame 510 as a logic value 0.

The low frequency receiver 106 further measures the time interval between the rising edge 508 and the rising edge 520 and determines that this measured time interval corresponds to a decoding value of 1.5×T. Accordingly, the low frequency receiver 106 decodes frames 512 and 514 as a logic value 0 and a logic value 1, respectively. Thus, as illustrated, the low frequency receiver can decode the values for multiple frames based on the timing interval between data transitions of the data stream 501.

In addition, the low frequency receiver 106 measures the time interval between the rising edge 520 and the rising edge 522 and determines that this measured time interval corresponds to a decoding value of T. The low frequency receiver compares the measured time interval to the table of decoding values. Based on this comparison, and based on the value of the frame 514, the low frequency receiver determines that the data value associated with the frame 516 is a logic value 1.

Figure 6:
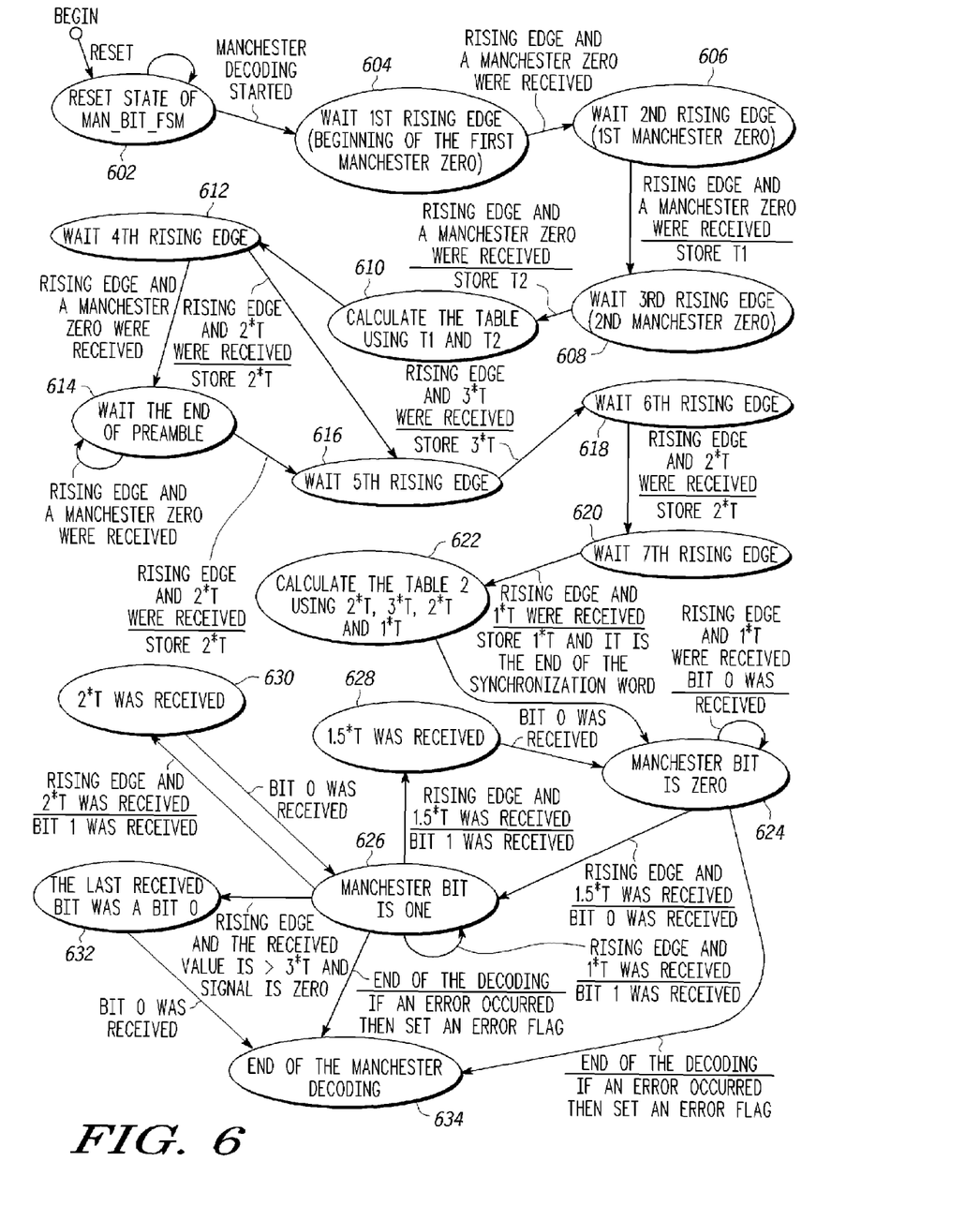
FIG. 6 is a state diagram of a particular embodiment of a method of decoding the data stream of FIG. 2.

Referring to FIG. 6, a state diagram of a particular embodiment of a method of decoding a received data stream is illustrated. Blocks 602, 604, 606, 608, 610, 612, 614, 616, 618, 620, and 622 represent a particular embodiment of a method for building decode interval tables. Blocks 624, 626, 628, 630, 632, and 634 represent a particular embodiment of a method of decoding the data stream using the decode interval tables.

At block 602, a data state bit of a decoding system is reset so that previously received data streams will not affect how the currently received data stream is decoded. Moving to block 604, the decoding system waits for a first rising edge of the data stream. At block 606, the decoding system waits for a second rising edge of the data stream. A time interval T1 is stored based on the interval between the first rising edge and the second rising edge.

Moving to block 608, the decoding system waits for a third rising edge of the data stream. A time interval T2 is stored based on the interval between the first rising edge and the third rising edge. At block 610 a decode interval table is built based on the time intervals T1 and T2. As illustrated, the decoding system measures additional intervals between rising edges of the data stream, at blocks 612, 614, 616, 618, and 620. At block 622 the additional measured intervals are used to build additional entries for the decode interval tables. In the illustrated particular embodiment, the measured intervals are based on a preamble and synchronization word of the received data stream.

Decoding of the data payload portion of the data stream begins at block 624. As illustrated, at block 624 a state bit of the decoding system is set to indicate that a Manchester bit value of zero was received. The decoding system then measures the interval between rising edges of the data stream. If the interval is equivalent to 1×T, as identified in the decoding tables, the decoding system indicates a decoded value of logic 0. The time interval T represents a minimum interval between encoded bits of the data stream. In addition, if the measured interval is equivalent to 1×T, the method remains at block 624.

If the measured interval is equivalent to 1.5×T, the decoding system indicates that a logic value 0 has been decoded from the data stream, and the method flow moves to block 626. At block 626, the state bit of the decoding system is set to indicate that a logic value of 1 will be decoded from the data stream.

At block 626, an interval between rising edges of the data stream is measured and compared to the decoding value tables to select a decoding value. Based on the selected decoding value, the decoding system provides different decoded values for the bit stream. For example, if the selected decoding value is 1×T, the decoding system indicates that a logic value of 1 has been decoded from the data stream and the method flow remains at block 626. If the selected decoding value is 1.5×T, the decoding system indicates that a logic value 1 has been received and the method flow moves to block 628. At block 628, the decoding system indicates that a logic value 0 has been decoded from the data stream and the method flow returns to block 624. Thus, at block 626 two sequential values of the data stream can be decoded based on one measured time interval.

At block 626, if the selected decoding value is 2×T, the decoding system indicates a logic value of 1 and the method flow moves to block 630. At block 630 the decoding system indicates that a logic value 0 has been received and the method flow returns to block 626.

If, at block 626, a decoding value greater than 3×T is selected, this indicates an end to the data payload portion of the data stream. Accordingly, the method flow moves to block 632 and the decoding system indicates that a logic value 0 was received. The method flow then moves to block 634 and the decoding system stops decoding the data stream.

In the particular embodiment illustrated in FIG. 6, the data stream is decoded based on the time interval between data transitions of the data stream, as well as the value of previously decoded data bits. Accordingly, the decoding system is able to decode the data stream even when the data stream experiences drift, jitter, or other timing changes.

Figure 7:
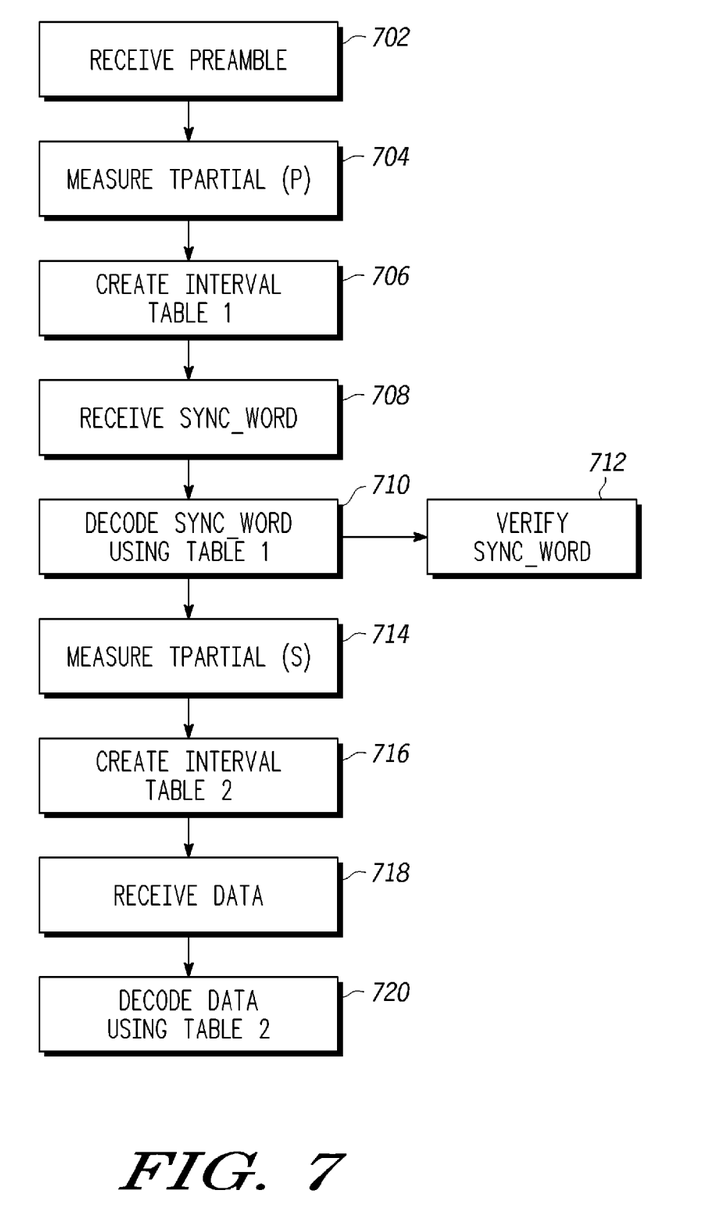
FIG. 7 is a flow diagram illustrating an alternative particular embodiment of a method of decoding the data payload portion of the data stream of FIG. 2.

Referring to FIG. 7, a flow diagram of a method of decoding a received data stream is illustrated. At block 702, a preamble portion of a header of the data stream is received. Moving to block 704, a time interval TPARTIAL(P) is measured between two consecutive edges of the same type of the received preamble. Proceeding to block 706, a first interval table is created based on the time interval TPARTIAL(P). In a particular embodiment, the first interval table is created according to the methods described above with respect to FIGS. 1-3. Moving to block 708, a synchronization word of the header of the data stream is received. Proceeding to block 710, the synchronization word is decoded using the first interval table created at block 706. Moving to block 712, the synchronization word is verified according to an expected value. Proceeding to block 714, a TPARTIAL value for the synchronization word, labeled TPARTIAL(S), is measured. Proceeding to block 716, a second interval table is created based on the synchronization word. At block 718 a data portion of the data stream is received. Proceeding to block 720, the data portion is decoded using the second interval table created at block 716.

Figure 8:
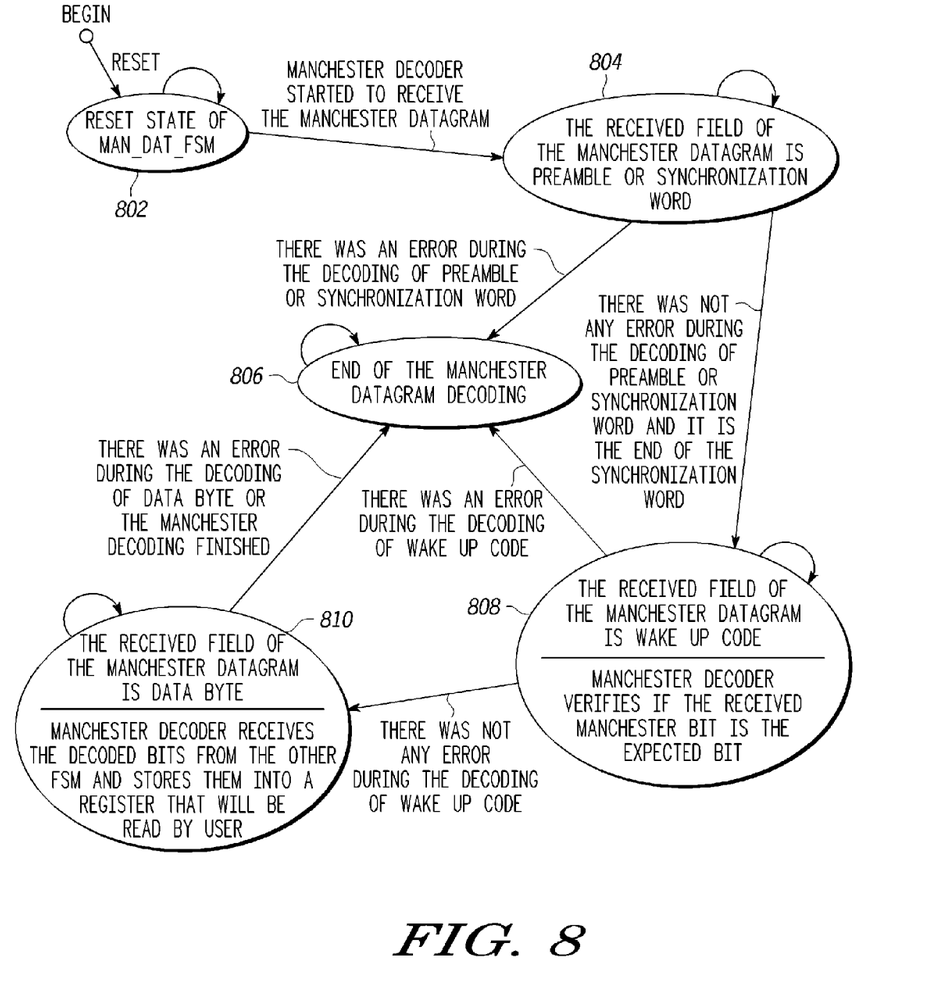
FIG. 8 is a state diagram illustrating a particular embodiment of a method of verifying the portions of the data stream of FIG. 1.

Referring to FIG. 8, a state diagram of a particular embodiment of a method of verifying the fields of a data stream, such as the data stream 200, is illustrated. The illustrated method can be implemented in conjunction with the method illustrated in FIG. 6.

At block 802, the method flow remains in a reset state until the beginning of a data stream (i.e. a Manchester datagram) is received. In response to the beginning of the data stream, the method flow moves to block 804, and it is determined whether an appropriate preamble portion and synchronization portion of the data stream have been detected. If an error is detected in the preamble portion or the synchronization portion, the method flow moves to block 806 and the decoding of the data stream is stopped.

If no errors are detected in the preamble portion and the synchronization portion, the method flow moves to block 808 and the wake-up code portion of the data stream is decoded. In addition, at block 808 it is determined whether the wake-up code portion contains errors. If errors are detected, the method flow moves to block 806 and the decoding of the data stream is stopped.

If no errors are detected in the wake-up code portion, the method flow moves to block 810 and the data payload portion of the data stream is decoded. In a particular embodiment, the data payload portion is decoded in accordance with the method of FIG. 6. In response to an end of the data payload portion being detected, or in response to detection of an error in the data payload portion, the method flow moves to block 806 and the decoding of the data stream is stopped.

It will be appreciated that the methods described herein may be implemented as, for example, a computer readable medium that embodies executable instructions that manipulate a processor or other computation system to perform the functions described herein.

In addition, the various methods in the present application may be implemented using an information handling machine such as a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. Generally, the methods readily implemented by one of ordinary skill in the art using one or more of the implementation techniques listed herein.

When a data processor for issuing instructions is used, the instruction may be stored in memory. Such a memory may be a single memory device or a plurality of memory devices. Such a memory device may be a computer readable medium such as a read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic. Such an information handling machine may be a system, or part of a system, such as a computer, a personal digital assistant (PDA), a hand held computing device, a cable set-top box, an Internet capable device, such as a cellular phone, and the like.

A method and system for decoding a data stream have been disclosed. The method includes detecting a first transition of a data stream, wherein the first transition is of a first transition type from a first logic state to a second logic state, detecting a second transition of the data stream, wherein the second logic transition is of the first transition type, determining a first time interval between the first edge and the second edge, and determining a logic value of a first data bit of the data stream based on the first interval. In a particular aspect, the second transition is the next edge of the first transition type after the first transition.

In a particular aspect, the method further includes determining a logic value of a second data bit of the data stream based on the first interval. In another particular aspect the second data bit has a different value than the first data bit.

In a particular aspect, determining the logic value includes determining which one of a plurality of possible interval ranges the first time interval is within. In a particular aspect, determining the logic value further includes determining that the logic value is different from a previously determined logic value when the first time interval is within an interval range greater than a minimum interval range.

In a particular aspect, the method further includes determining the plurality of possible interval ranges based on a header of the data stream. In another particular aspect, the method includes determining the plurality of possible interval ranges based on a synchronization word of the data stream. In still another particular aspect, the method includes determining an end of the data stream based on the first time interval. In a particular aspect the end of the data stream is determined based on the first time interval being greater than an expected time interval.

In a particular aspect, the method includes receiving a first portion of a header of the data stream, decoding a second portion of the header based on the first portion to produce an authentication value, and validating the authentication value. In another particular aspect, the second portion of the header is a synchronization word.

The system includes a computer readable medium comprising a computer program, the computer program including instructions to detect a first transition of a data stream, wherein the first transition is of a first transition type from a first logic state to a second logic state, instructions to detect a second transition of the data stream, wherein the second logic transition is of the first transition type, instructions to determine a first time interval between the first edge and the second edge, and instructions to determine a logic value of a first data bit of the data stream based on the first interval.

In a particular aspect, the computer program further includes instructions to determine a logic value of a second data bit of the data stream based on the first interval. In another particular aspect the second data bit has a different value than the first data bit. In still another particular aspect, the computer program further includes instructions to determine a plurality of possible interval ranges based on a first portion of the data stream.

In a particular aspect determining the logic value of the first data bit includes determining the logic value is at a first level in response to the first time interval being within a minimum range of the plurality of possible interval ranges and determining the logic value is at a second level in response to the first time interval being within an interval range greater than the minimum interval range. In another particular aspect, the first portion of the data stream is a synchronization word of the data stream. In a particular aspect, the computer program further includes instructions to decode the first portion of the header to produce an authentication value; and instructions to validate the authentication value.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method, comprising:
   detecting a first transition of a data stream, wherein the first transition is of a first transition type from a first logic state to a second logic state;
   detecting a second transition of the data stream, wherein the second transition is of the first transition type;
   determining a first time interval between the first transition and the second transition; and
   determining a logic value of a first data bit of the data stream based on the first time interval.

2. The method of claim 1, wherein a second transition is the next transition of the first transition type after the first transition.

3. The method of claim 1, further comprising:
   determining a logic value of a second data bit of the data stream based on the first time interval.

4. The method of claim 3, wherein the second data bit has a different value than the first data bit.

5. The method of claim 1, wherein determining the logic value comprises determining which one of a plurality of possible interval ranges the first time interval is within.

6. The method of claim 5, wherein determining the logic value further comprises determining that the logic value is different from a previously determined logic value when the first time interval is within an interval range greater than a minimum interval range.

7. The method of claim 5, further comprising
   determining the plurality of possible interval ranges based on a header of the data stream.

8. The method of claim 5, further comprising
   determining the plurality of possible interval ranges based on a synchronization word of the data stream.

9. The method of claim 1, further comprising:
   determining an end of the data stream based on the first time interval.

10. The method of claim 9, wherein the end of the data stream is determined based on the first time interval being greater than an expected time interval.

11. The method of claim 1, further comprising:
    receiving a first portion of a header of the data stream;
    decoding a second portion of the header based on the first portion to produce an authentication value; and
    validating the authentication value.

12. The method of claim 11, wherein the second portion of the header is a synchronization word.

13. A computer readable medium comprising a computer program, the computer program comprising instructions to manipulate a processor, the instructions comprising:
    instructions to detect a first transition of a data stream, wherein the first transition is of a first transition type from a first logic state to a second logic state;
    instructions to detect a second transition of the data stream, wherein the second transition is of the first transition type;
    instructions to determine a first time interval between the first transition and the second transition; and
    instructions to determine a logic value of a first data bit of the data stream based on the first time interval.

14. The computer readable medium of claim 13, the computer program further comprising:
  instructions to determine a logic value of a second data bit of the data stream based on the first time interval.

15. The computer readable medium of claim 14, wherein the second data bit has a different value than the first data bit.

16. The computer readable medium of claim 13, the computer program further comprising:
  instructions to determine a plurality of possible interval ranges based on a first portion of the data stream.

17. The computer readable medium of claim 16, wherein determining the logic value of the first data bit comprises determining the logic value is at a first level in response to the first time interval being within a minimum range of the plurality of possible interval ranges and determining the logic value is at a second level in response to the first time interval being within an interval range greater than the minimum interval range.

18. The computer readable medium of claim 16, wherein the first portion of the data stream is a synchronization word of the data stream.

19. The computer readable medium of claim 18, the computer program further comprising:
  instructions to decode the first portion of the header to produce an authentication value; and
  instructions to validate the authentication value.

* * * * *